(12) United States Patent
Tashima (10) Patent No.: US 12,238,857 B2
(45) Date of Patent: Feb. 25, 2025

(54) ELECTRONIC CONTROL DEVICE

(71) Applicant: DENSO CORPORATION, Kariya (JP)

(72) Inventor: Tsuyoshi Tashima, Kariya (JP)

(73) Assignee: DENSO CORPORATION, Kariya (JP)

( * ) Notice: Subject to any disclaimer, the term of this patent is extended or adjusted under 35 U.S.C. 154(b) by 153 days.

(21) Appl. No.: 17/657,433

(22) Filed: Mar. 31, 2022

(65) Prior Publication Data

US 2022/0225497 A1    Jul. 14, 2022

Related U.S. Application Data

(63) Continuation of application No. PCT/JP2020/035198, filed on Sep. 17, 2020.

(30) Foreign Application Priority Data

Oct. 3, 2019    (JP) .................................. 2019-183116

(51) Int. Cl.
*H05K 1/02* (2006.01)
*H05K 1/18* (2006.01)
*H02P 27/06* (2006.01)

(52) U.S. Cl.
CPC ........... *H05K 1/0296* (2013.01); *H05K 1/181* (2013.01); *H02P 27/06* (2013.01); *H05K 2201/09036* (2013.01)

(58) Field of Classification Search
CPC .......... H05K 1/02; H05K 1/0203; H05K 1/18; H05K 1/181–187; H05K 7/209; H05K 7/1432; H05K 7/20854; H02K 11/02; H02K 11/30; H02K 11/33; B62D 5/0406; B62D 5/0463

USPC ................ 361/760–764, 792–795, 777–778, 361/782–784; 174/250–258

See application file for complete search history.

(56) References Cited

U.S. PATENT DOCUMENTS

| | | | | | |
|---|---|---|---|---|---|
| 5,956,231 | A * | 9/1999 | Yamada | ............... | H01L 25/0655 361/728 |
| 7,438,560 | B2 * | 10/2008 | Takahashi | ............ | H05K 1/0239 439/70 |
| 8,530,750 | B2 * | 9/2013 | Koyama | ............... | H05K 1/0216 174/258 |
| 8,618,632 | B2 * | 12/2013 | Kawashima | ........ | H01L 27/0694 257/532 |
| 8,654,542 | B2 * | 2/2014 | Murase | ................ | H05K 1/0227 361/783 |
| 10,763,729 | B2 * | 9/2020 | Sugiura | ................... | H02K 11/40 |
| 2002/0158306 | A1 * | 10/2002 | Niitsu | ..................... | H01L 28/10 257/E21.022 |
| 2002/0176236 | A1 * | 11/2002 | Iguchi | ................. | H05K 9/0039 361/753 |
| 2006/0232949 | A1 * | 10/2006 | Osaka | ................... | H05K 1/0236 174/255 |
| 2007/0215913 | A1 * | 9/2007 | Okubora | ............. | H01L 25/0657 257/E25.013 |

(Continued)

*Primary Examiner* — Tuan T Dinh
(74) *Attorney, Agent, or Firm* — Maschoff Brennan (57) ABSTRACT

An electronic control device includes a plurality of drive control components and a substrate. The plurality of drive control components are grouped into systems. Each of systems is configured to control a control target independently. The substrate is divided into areas, corresponding to the systems, on which at least a part of the drive control components is mounted by each of the systems, and has layers stacked.

6 Claims, 9 Drawing Sheets

(56) References Cited

U.S. PATENT DOCUMENTS

| | | | |
|---|---|---|---|
| 2008/0117609 A1* | 5/2008 | Itou | H05K 1/0227 |
| | | | 361/761 |
| 2014/0301047 A1* | 10/2014 | Kato | H05K 1/0215 |
| | | | 174/254 |
| 2016/0181885 A1 | 6/2016 | Yamasaki | |
| 2017/0217481 A1* | 8/2017 | Asao | B62D 5/0487 |
| 2020/0036269 A1 | 1/2020 | Sugiura | |

* cited by examiner

ELECTRONIC CONTROL DEVICE

CROSS REFERENCE TO RELATED APPLICATIONS

The present application is a continuation application of International Patent Application No. PCT/JP2020/035198 filed on Sep. 17, 2020, which designated the U.S. and claims the benefit of priority from Japanese Patent Application No. 2019-183116 filed on Oct. 3, 2019. The entire disclosures of all of the above applications are incorporated herein by reference.

TECHNICAL FIELD

The present disclosure relates to an electronic control device.

BACKGROUND

A drive device in which a motor and a control unit are integrally formed is known. For example, an O-ring is provided between a motor case and a frame, and a frame member and a cover member are fixed by an adhesive to prevent water droplets and the like from entering the inside.

SUMMARY

The present disclosure provides an electronic control device. The electronic control device includes a plurality of drive control components and a substrate. The plurality of drive control components are grouped into systems. Each of systems is configured to control a control target independently. The substrate is divided into areas, corresponding to the systems, on which at least a part of the drive control components is mounted by each of the systems, and has layers stacked.

BRIEF DESCRIPTION OF DRAWINGS

The features and advantages of the present disclosure will become more apparent from the following detailed description made with reference to the accompanying drawings. In the drawings.

DETAILED DESCRIPTION

For example, when a wiring pattern is separated and one substrate is shared by a plurality of systems, if a conductive foreign matter is entered from the separated portion, there is a possibility that the plurality of systems may fail at the same time due to a short circuit between the systems. Even if it is configured to prevent foreign matter from entering from the outside, there is a possibility that a failure may occur due to foreign matter or ion migration that has entered from the beginning at the time of manufacture. The present disclosure provides an electronic control device capable of reducing a probability of simultaneous failure of a plurality of systems.

An exemplary embodiment of the present disclosure provides an electronic control device. An electronic control device includes a plurality of drive control components and a substrate. The plurality of drive control components are grouped into systems. Each of systems is configured to control a control target independently. The substrate is divided into areas, corresponding to the systems, on which at least a part of the drive control components is mounted by each of the systems, and has layers stacked. Each of the layers has a wiring pattern and forms a slit that divides the substrate into the areas defined as system areas. The slit has a width greater than a minimum pattern gap in the substrate. In the exemplary embodiment of the present disclosure, it is possible to suppress the occurrence of a short circuit between systems due to a foreign matter, ion migration, or the like, and thus it is possible to reduce the probability of simultaneous failure of the plurality of systems.

Embodiment

Figure 1:
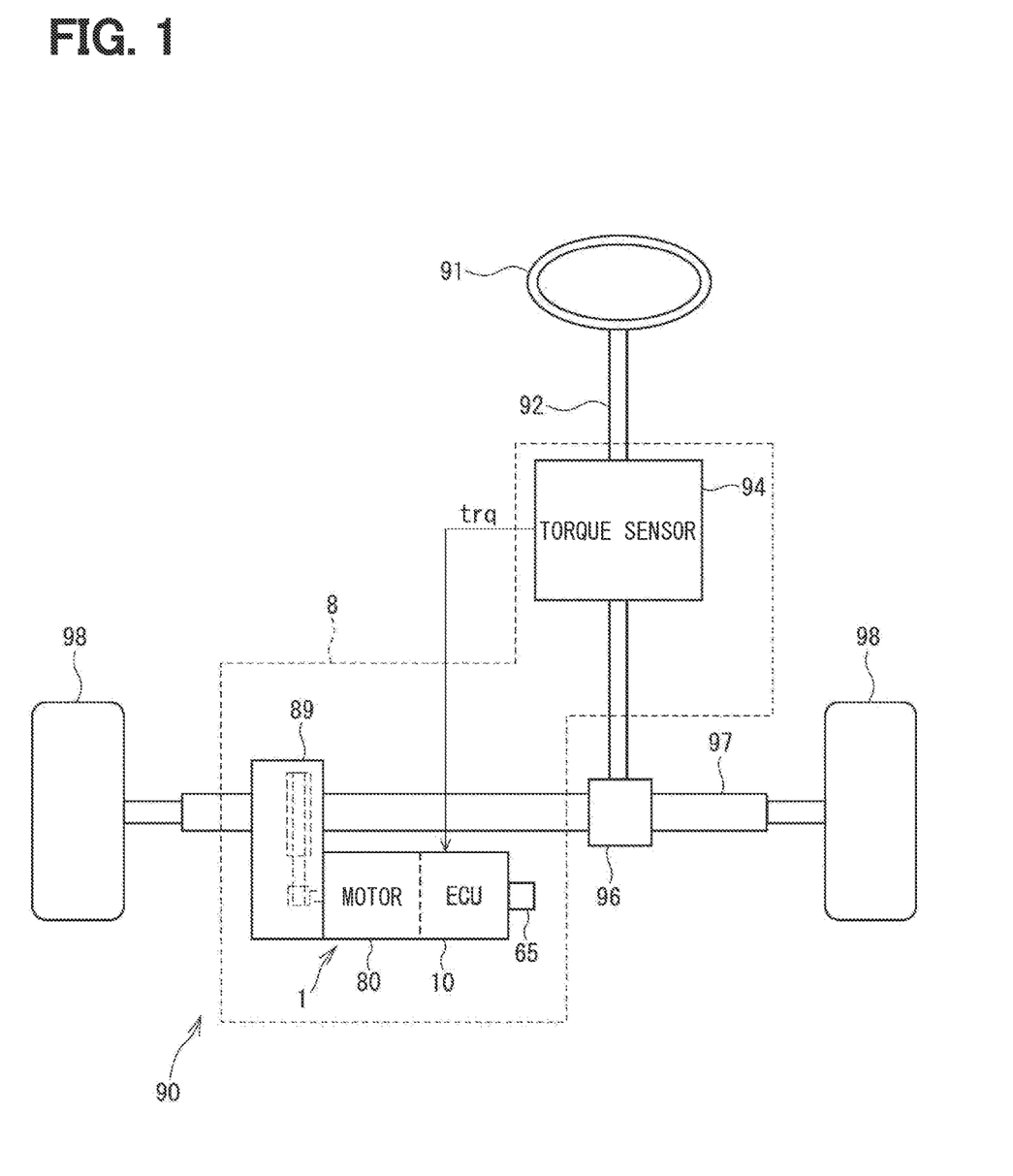
FIG. 1 is a schematic structural diagram showing a steering system according to an embodiment.

Hereinafter, an electronic control device according to the present disclosure will be described with reference to the drawings. The electronic control device according to one embodiment is shown in FIGS. 1 to 10. As shown in FIG. 1, a drive device 1 according to a first embodiment includes a motor 80 and an ECU 10 as an electronic control device, and is applied to an electric power steering device 8, which assists a steering operation of a vehicle. FIG. 1 shows an overall configuration of a steering system 90 including the electric power steering device 8. The steering system 90 includes a steering wheel 91 as a steering member, a steering shaft 92, a pinion gear 96, a rack shaft 97, wheels 98, the electric power steering device 8, and the like.

The steering wheel 91 is connected to the steering shaft 92. The steering shaft 92 is provided with a torque sensor 94 for detecting a steering torque Trq. The torque sensor 94 is internally systematized into two systems, and the detected values of the two systems are output to the corresponding microcomputers 170 and 270. The pinion gear 96 is provided at an axial end of the steering shaft 92. The pinion gear 96 meshes with a rack shaft 97. A pair of road wheels 98 is coupled at both ends of the rack shaft 97 via, for example, tie rods. When a driver of the vehicle rotates the steering wheel 91, the steering shaft 92 connected to the steering wheel 91 rotates. A rotational movement of the steering shaft 92 is converted into a linear movement of the rack shaft 97 by the pinion gear 96. The pair of road wheels 98 is steered to an angle corresponding to a displacement amount of the rack shaft 97.

The electric power steering device 8 includes a drive device 1, a reduction gear 89 as a power transmission unit that reduces the rotation of the motor 80 and transmits the rotation to the rack shaft 97, and the like. The electric power steering device 8 of the present embodiment is a so-called "rack assist type", but may be a so-called "column assist type" or the like that transmits the rotation of the motor 80 to the steering shaft 92.

Figure 2:
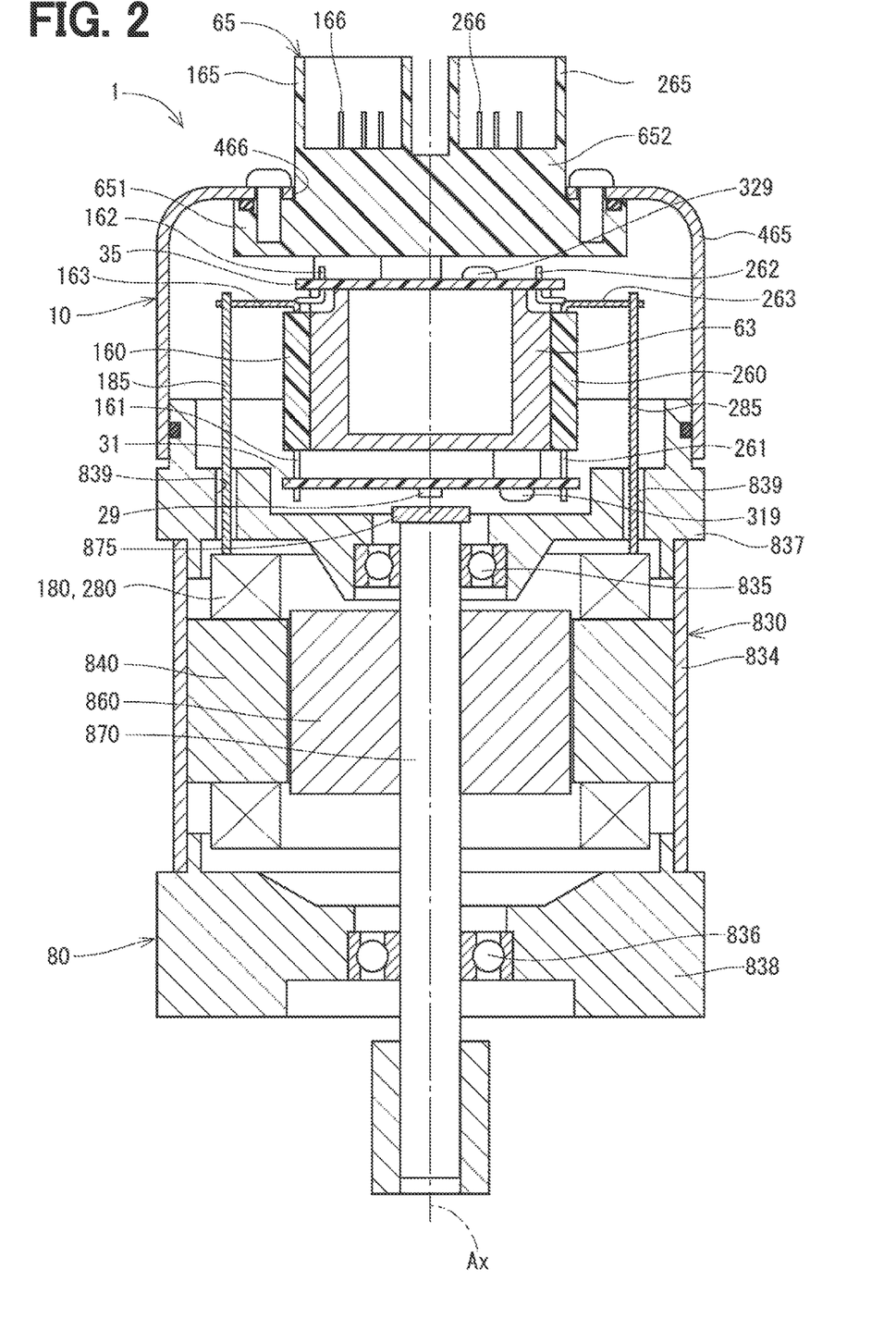
FIG. 2 is a cross-sectional view showing a drive device according to the embodiment.
Figure 3:
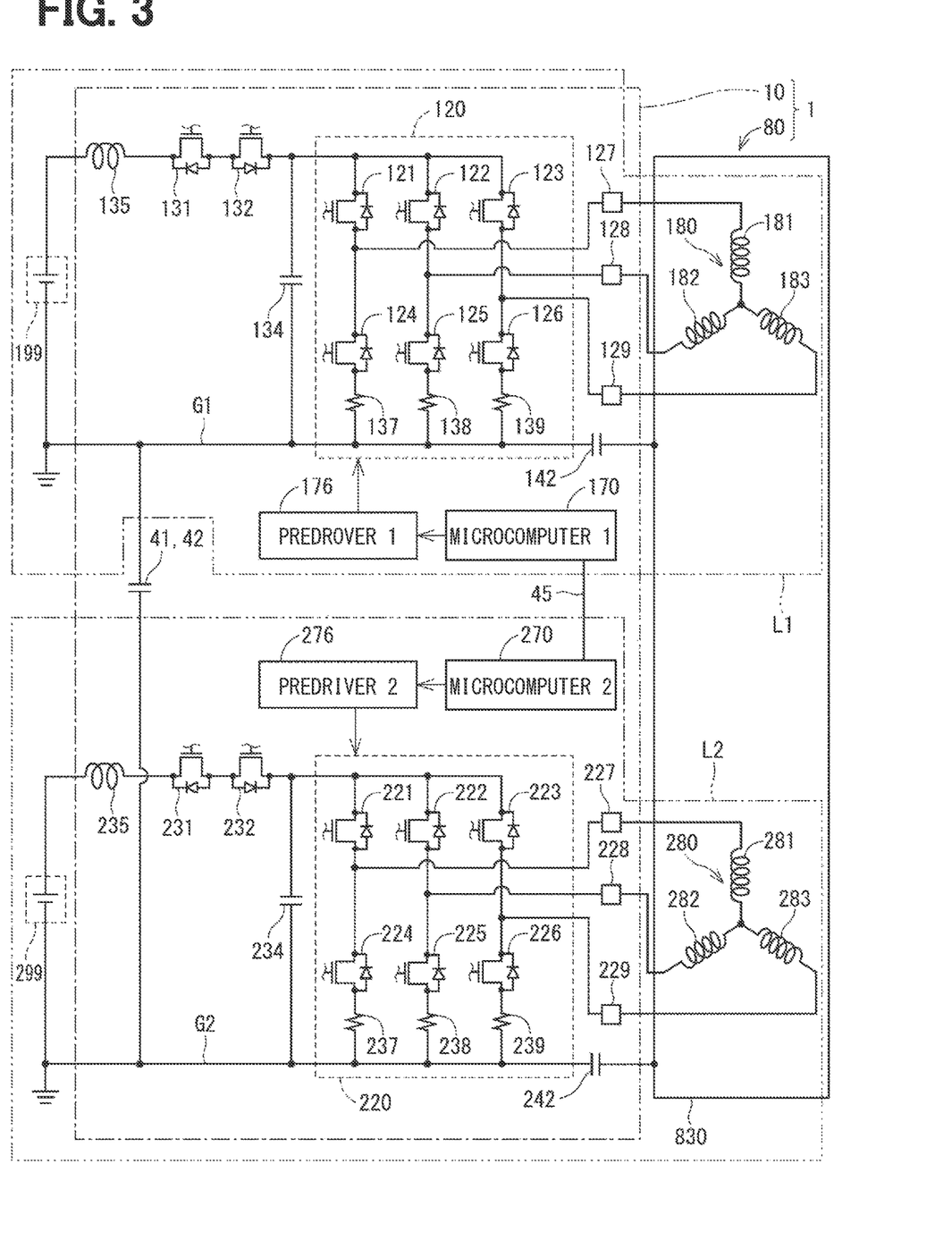
FIG. 3 is a circuit diagram showing a drive device according to the embodiment.

As shown in FIGS. 2 and 3, the motor 80 is a three-phase brushless motor. The motor 80 outputs part or all of a torque required for steering, and is driven by a power supplied from batteries 199 and 299 to rotate the reduction gear 89 forward and backward.

The motor 80 has a first motor winding 180 and a second motor winding 280. The motor windings 180 and 280 have the same electrical characteristics and are wound about the stator 840 with electrical angles changed from each other by 30 degrees. Correspondingly, phase currents are controlled to be supplied to the motor windings 180 and 280 such that the phase currents have a phase difference φ of 30 degrees. By optimizing the current supply phase difference, the output torque can be improved. In addition, sixth-order torque ripple can be reduced, and noise and vibration can be reduced. In addition, since heat is also distributed and averaged by distributing the current, it is possible to reduce temperature-dependent system errors such as a detection value and torque of each sensor and increase the amount of current that is allowed to be supplied. The motor windings 180 and 280 do not have to be cancel-wound and may have different electrical characteristics.

Hereinafter, a combination of configurations relating to the energization control of the first motor winding 180 will be referred to as a first system L1, and a combination of configurations relating to the energization control of the second motor winding 280 will be referred to as a second system L2. The configuration of the first system L1 is mainly numbered in the 100's, the configuration of the second system L2 is mainly numbered in the 200's, and the configurations substantially similar to each other in the systems L1 and L2 are numbered so that the last two digits are the same, and a description of those configurations will be omitted as appropriate. As appropriate, an index of "1" is added to a component or a value related to the first system L1, and an index of "2" is added to a component or a value related to the second system L2.

As shown in FIG. 2, in the drive device 1, the ECU 10 is integrally provided on one side in the axial direction of the motor 80 in a machine-electronics integrated type. The motor 80 and the ECU 10 may alternatively be provided separately. The ECU 10 is positioned coaxially with an axis Ax of the shaft 870 on the side opposite to the output shaft of the motor 80. The ECU 10 may alternatively be provided on the output shaft side of the motor 80. By adopting the mechanically-electrically integrated type, it may be possible to efficiently position the ECU 10 and the motor 80 in a vehicle having restriction for mounting space.

The motor 80 includes, in addition to the stator 840 and rotor 860, a housing 830 that houses the stator 840 and the rotor 860, or the like. The stator 840 is fixed to the housing 830 and the motor windings 180 and 280 are wound thereon. The rotor 860 is placed radially inside the stator 840 to be rotatable relative to the stator 840.

The shaft 870 is fitted in the rotor 860 to rotate integrally with the rotor 860. The shaft 870 is rotatably supported by the housing 830 through bearings 835 and 836. The end portion of the shaft 870 on the ECU 10 side protrudes from the housing 830 to the ECU 10 side. A magnet 875 is placed at the end of the shaft 870 on the ECU 10 side.

The housing 830 has a cylindrical case 834, a rear frame end 837 provided at one end of the case 834, and a front frame end 838 provided at the other end of the case 834. Lead wire insertion holes 839 are formed in the rear frame end 837. Lead wires 185 and 285 connected to each phase of the motor windings 180 and 280 are inserted through the lead wire insertion holes 839. The lead wires 185 and 285 are taken out from the lead wire insertion holes 839 to the ECU 10.

The ECU 10 includes a control substrate 31, a power substrate 35, a heat sink 63, power modules 160, 260 and the like. The cover 465 is formed in a substantially bottomed cylindrical shape and fits radially outward of the rear frame end 837. The cover 465 is provided so as to cover the substrates 31 and 32 and the power modules 160 and 260. An opening 466 is provided at the bottom of the cover 465.

The connector 65 has a base portion 651 and a connector portion 652. The base portion 651 is fixed to the cover 465 by s bolt or the like. The connector portion 652 is taken out axially from the opening 466 of the cover 465. The front end of the connector portion 652 is opened in the axial direction, and provided to enable a harness (not shown) to be inserted and removed from the side opposite to the motor 80. The connector portion 652 of the present embodiment is divided into a first connector portion 165 and a second connector portion 265. The first connector portion 165 is provided with a first connector terminal 166 connected to the first system L1, and the second connector portion 265 is provided with a second connector terminal 266 connected to the second system L2. The first connector terminal 166 includes a first power supply terminal, a first ground terminal, and a first signal terminal, and the second connector terminal 266 includes a second power supply terminal, a second ground terminal, and a second signal terminal.

The control substrate 31 is formed in a substantially rectangular shape, and is fixed to the surface of the heat sink 63 on the motor 80 side with a bolt 319. The power substrate 35 is formed in a substantially rectangular shape, and is fixed to the surface of the heat sink 63 opposite to the motor 80 by a bolt 329. The ground pattern of the control substrate 31 is electrically connected to the heat sink 63 via the bolt 319. Similarly, the ground pattern of the power substrate 35 is electrically connected to the heat sink 63 via the bolt 329.

The heat sink 63 is fixed to the rear frame end 837 and has the same potential as the housing 830. The heat sink 63 and the rear frame end 837 may be integrated or separate. The heat sink 63 is made of a metal having good thermal conductivity such as aluminum, and power modules 160 and 260 are provided on the side surfaces so as to be able to dissipate heat. That is, in this embodiment, the power modules 160 and 260 are vertically arranged along the axial direction of the motor 80.

The first power module 160 includes switching elements 121 to 126, motor relays 127 to 129, and shunt resistors 137 to 139 that constitute the first inverter 120. The second power module 260 includes switching elements 121 to 126, motor relays 227 to 229, and shunt resistors 237 to 239 that constitute the second inverter 220. Control terminals 161 and 261 connected to the control substrate 31 are respectively provided on the power modules 160 and 260 on the control substrate 31 side. On the power substrate 35 side of the power modules 160 and 260, power terminals 162 and 262 connected to the power substrate 35 and motor terminals 163 and 263 connected to the lead wires 185 and 285 are provided. The motor terminals 163 and 263 are bent in the direction opposite to the heat sink 63 and connected to the lead wires 185 and 285.

FIG. 3 shows a circuit configuration of the drive device 1. The ECU 10 includes a first inverter 120, first motor relays 127 to 129, first power supply relays 131 and 132, and a first capacitor 134 and a first coil 135, which are provided corresponding to the first motor winding 180. The ECU 10 includes a second inverter 220, second motor relays 227 to 229, second power supply relays 231 and 232, and a second capacitor 234 and a second coil 235, which are provided corresponding to the second motor winding 280.

The first inverter 120 and the like of the first system L1 are supplied with electric power from the first battery 199, and the second inverter 220 and the like of the second system L2 are supplied with electric power from the second battery 299. In the present embodiment, the ground is also separated by the first system L1 and the second system L2. The energization of the first motor winding 180 is controlled by a first microcomputer 170, and the energization of the second motor winding 280 is controlled by a second microcomputer 270. In other words, in the present embodiment, the first system L1 and the second system L2 are provided independently of each other in a completely redundant configuration.

The first inverter 120 is a three-phase inverter, and the first switching elements 121 to 126 are connected in a bridge manner. The switching elements 121 to 123 are connected to the high potential side, and the switching elements 124 to 126 are connected to the low potential side. A connection point of the paired U-phase switching elements 121 and 124 is connected to one end of a first U-phase coil 181. A connection point of the paired V-phase switching elements 122 and 125 is connected to one end of a first V-phase coil 182. A connection point of the paired W-phase switching elements 123 and 126 is connected to one end of a first W-phase coil 183. The other ends of the coils 181 to 183 are connected to each other. Shunt resistors 137 to 139, which are current detection elements for detecting currents flowing in the coils 181 to 183, are provided on the low potential side of the switching elements 124 to 126, respectively.

The second inverter 220 is a three-phase inverter, and the second switching elements 221 to 226 are bridge-connected. The switching elements 221 to 223 are connected to the high potential side, and the switching elements 224 to 226 are connected to the low potential side. A connection point of the paired U-phase switching elements 221 and 224 is connected to one end of a second U-phase coil 281. A connection point of the paired V-phase switching elements 222 and 225 is connected to one end of a second V-phase coil 282. A connection point of the paired W-phase switching elements 223 and 226 is connected to one end of a second W-phase coil 283. The other ends of the coils 281 to 283 are connected to one another. Shunt resistors 237 to 239, which are current detection elements for detecting currents flowing in the coils 281 to 283, are provided on the low potential side of the switching elements 224 to 226.

The first motor relays 127 to 129 are provided between the first inverter 120 and the first motor winding 180, and are provided to be able to connect and disconnect the first inverter 120 and the first motor winding 180. The motor relay 127 of the U-phase is provided between the connection point of switching elements 121 and 124 and the U-phase coil 181, and the motor relay 128 of the V-phase is provided between the connection point of switching elements 122 and 125 and the V-phase coil 182. The motor relay 129 of the W-phase is provided between the connection point of the switching elements 123 and 126 and the W-phase coil 183.

The second motor relays 227 to 229 are provided between the second inverter 220 and the second motor winding 280, and are provided to be able to connect and disconnect the second inverter 220 and the second motor winding 280. The motor relay 227 of the U-phase is provided between the connection point of switching elements 221 and 224 and the U-phase coil 281. The motor relay 228 of the V-phase is provided between the connection point of switching elements 222 and 225 and the V-phase coil 282. The motor relay 229 of the W-phase is provided between the connection point of the switching elements 223 and 226 and the W-phase coil 283.

The first power supply relays 131 and 132 are connected in series with each other so that orientations of parasitic diodes are opposite to each other, and are provided between the first battery 199 and the first inverter 120. The second power supply relays 231 and 232 are connected in series with each other so that orientations of parasitic diodes are opposite to each other, and are provided between the second battery 299 and the second inverter 220. By connecting the parasitic diodes in the reverse direction, the reverse current is prevented from flowing when the batteries 199 and 299 are mistakenly connected in the reverse direction, and the ECU 10 is protected.

In the present embodiment, the switching elements 121 to 126, 221 to 226, the motor relays 127 to 129, 227 to 229, and the power supply relays 131, 132, 231, and 232 are all MOSFETs, but may be provided by IGBTs, thyristors, or the like. The power supply relays 131, 132, 231 and 232 may be mechanical relays.

The first switching elements 121 to 126, the first motor relays 127 to 129, and the first power supply relays 131 and 132 are turned on and off by a drive signal output from a predriver 176 based on a control signal from the first microcomputer 170. The second switching elements 221 to 226, the second motor relays 227 to 229, and the second power supply relays 231 and 232 are turned on and off by the drive signal output from a predriver 276 based on a control signal from the second microcomputer 270. As a result, the drive of the motor 80 is controlled by the microcomputers 170 and 270. In addition, in order to avoid complication, some control lines are omitted in FIG. 3.

The first capacitor 134 is connected in parallel with the first inverter 120, and the second capacitor 234 is connected in parallel with the second inverter 220. The capacitors 134 and 234 are formed of, for example, aluminum electrolytic capacitors. The first coil 135 is provided between the first battery 199 and the first power supply relay 131, and the second coil 235 is provided between the second battery 299 and the second power supply relay 231.

The first capacitor 134 and the first coil 135, as well as the second capacitor 234 and the second coil 235, which form a filter circuit, reduce noise transmitted from other devices sharing the batteries 199 and 299, and noise transmitted from the drive device 1 to the other devices sharing the batteries 199 and 299. In addition, the capacitors 134 and 234 store electric charges, thereby assisting a power supply to the inverters 120 and 220. The power relays 131, 132, 231 and 232, the capacitors 134 and 234, and the coils 135 and 235 are mounted on the power substrate 35. The power relays 131, 132, 231 and 232 may be provided in the power modules 160 and 260.

Inter-system ground connection capacitors 41 and 42 connect a first system ground G1 and a second system ground G2. A first electromechanical connection capacitor 142 connects the first system ground G1 and the housing 830 of the motor 80. A second electromechanical connection capacitor 242 connects the second system ground G2 and the housing 830. The capacitors 41, 42, 142, and 242 are, for example, chip capacitors and are mounted on the control substrate 31. By providing the inter-system ground connection capacitors 41 and 42 and the electromechanical connection capacitors 142 and 242, a path for feeding back the noise propagated to the motor side to the ECU 10 side is formed, so that the propagation of noise to the outside can be reduced.

The microcomputers 170 and 270, the first integrated circuit unit 175 including the first predriver 176, the second integrated circuit unit 275 including the second predriver 276, and the rotation angle sensor 29 (see FIG. 2) are mounted on the control substrate 31. In this embodiment, the microcomputers 170 and 270 and the rotation angle sensor 29 are mounted on the motor surface 311 which is a surface of the control substrate 31 on the motor 80 side, and the integrated circuit units 175 and 275 are mounted on the anti-motor surface 312 which is a surface of the control substrate 31 on the opposite side of the motor 80. Further, the microcomputers 170 and 270 perform inter-microcomputer communication via a communication line 45.

Figure 4:
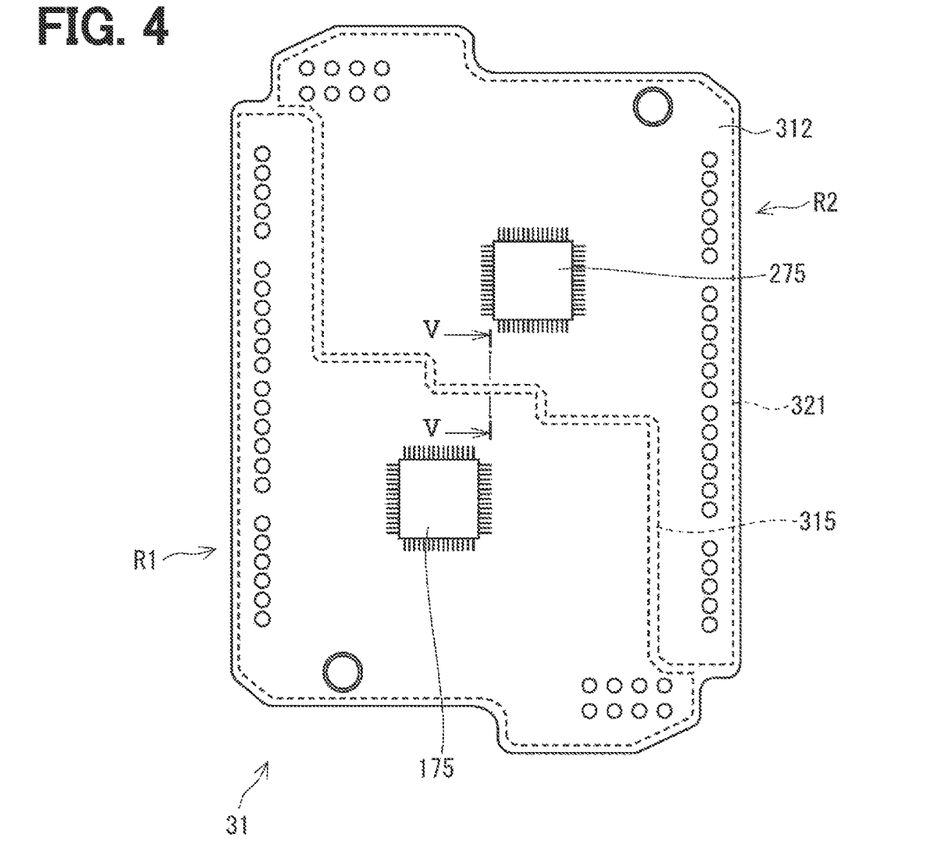
FIG. 4 is a plan view showing a counter-motor surface of a control board according to the embodiment.
Figure 5:
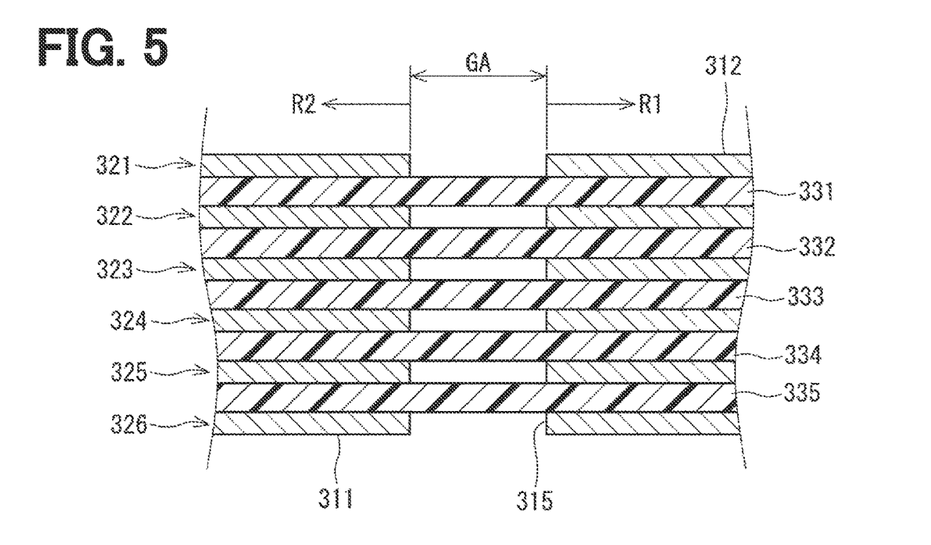
FIG. 5 is a cross sectional view taken along a line V-V of FIG. 4.

Details of the control substrate 31 are shown in FIGS. 4 to 10. Hereinafter, the control substrate 31 is simply referred to as a "substrate" as appropriate. In FIG. 4, the anti-motor surface 312 of the substrate 31 is shown, and a wiring pattern 321 of the outermost layer on the anti-motor surface 312 side is shown by a broken line. The wiring pattern is mainly described by simplifying the ground pattern. In addition, wiring patterns, vias, resists, mounting parts, etc. are omitted as appropriate. As shown in FIG. 5, the control substrate 31 of the present embodiment is a printed circuit board, having a six-layer, on which wiring patterns 321 to 326 are stacked. Further, insulating layers 331 to 335 are formed between the wiring patterns 321 to 326.

Figure 6:
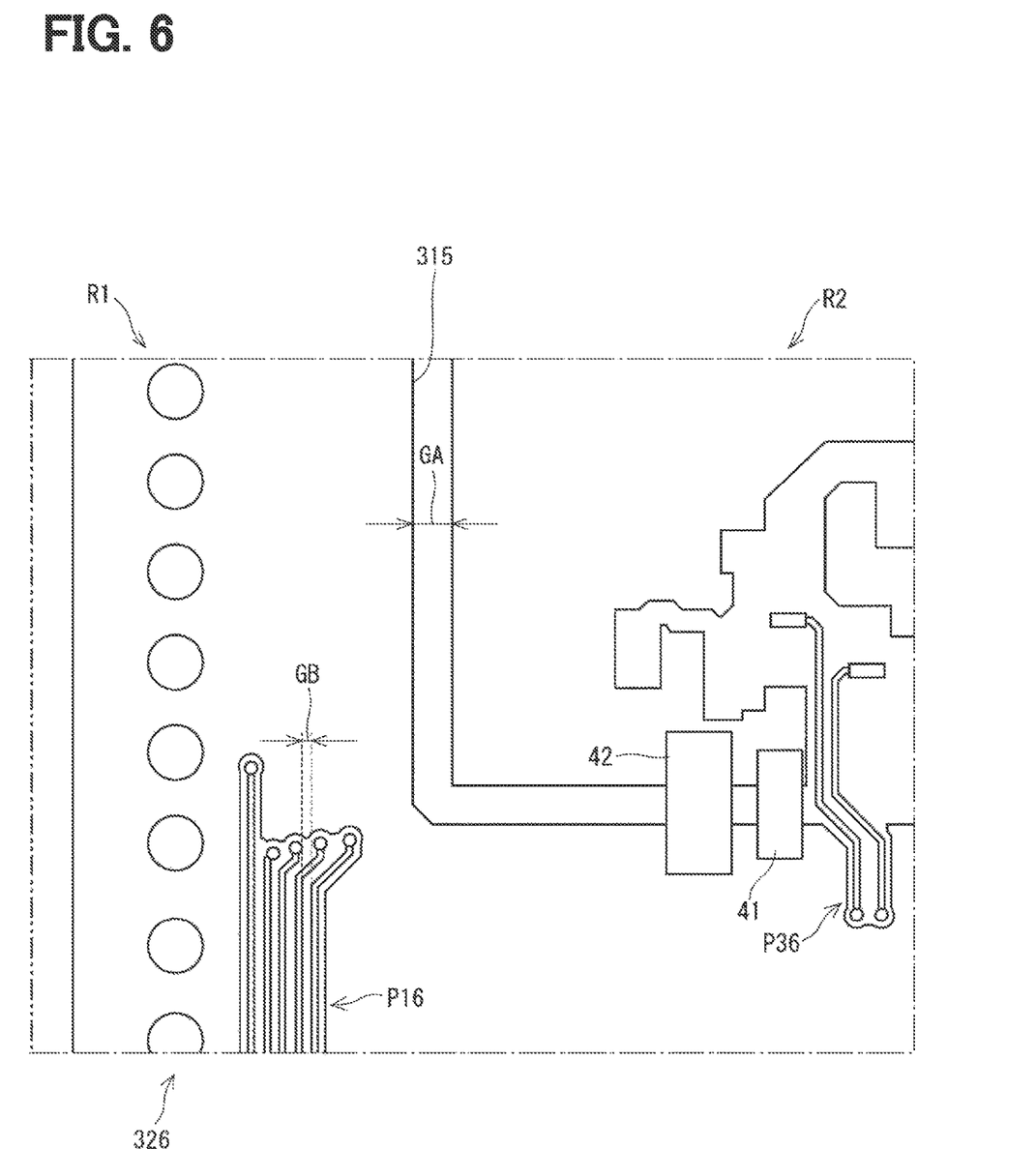
FIG. 6 is a schematic diagram showing a slit and a minimum pattern gap according to the embodiment.

Hereinafter, from the anti-motor surface 312 side, the wiring pattern 321 is defined as a first layer, the wiring pattern 322 is defined as a second layer, the wiring pattern 323 is defined as a third layer, the wiring pattern 324 is defined as a fourth layer, the wiring pattern 325 is defined as a fifth layer, and the wiring pattern 326 is defined as a sixth layer. In FIGS. 6 to 10, the wiring pattern is shown as a solid line and the outer line of the substrate 31 is shown as a two-dot chain line. Further, in FIGS. 6 and 9 showing the sixth layer which is the outermost layer on the motor surface 311 side, various electronic components mounted on the motor surface 311 are arranged on the back side of the paper surface, but in order to avoid complication, they are shown by solid lines.

As shown in FIGS. 4 and 5, the wiring patterns 321 to 326 of each layer are formed a slit 315 that separate a first system area R1 and a second system area R2. The electronic components constituting the first system L1 are mounted in the first system area R1, and the electronic components constituting the second system L2 are mounted in the second system area R2. Specifically, the first microcomputer 170 and the first integrated circuit unit 175 are mounted in the first system area R1, and the second microcomputer 270 and the second integrated circuit unit 275 are mounted in the second system area R2. Further, the rotation angle sensor 29 is located at a position facing the magnet 875 of the motor surface 311 and is arranged so as to cover the first system area R1 and the second system area R2. In this embodiment, the rotation angle sensor 29 is mounted on the center point of the substrate 31. The rotation angle sensor 29 is systematized in two systems inside the package.

FIG. 6 is an enlarged view of the sixth layer. As shown in FIG. 6, a gap GA, which is the width of the slit 315, is formed to be larger than the minimum pattern gap GB (for example, 0.2 mm) in the control substrate 31, for example, 1 mm or more. Further, the gap GA is formed larger than the minimum foreign matter size that can be removed in the manufacturing process. This makes it possible to prevent the occurrence of a short circuit between systems due to the entry of conductive foreign matter into the gap GA. Even when some of the wiring other than the slit 315 is short-circuited due to a conductive foreign matter or the like, if the other system is normal, the control in the other system can be continued and the simultaneous failure of the two systems can be avoided.

As shown in FIG. 5, the slit 315 is formed at the same position when projected from one of the motor surface 311 and the anti-motor surface 312 to the other, and, in the gap projection area, a planar pattern such as a ground pattern is not formed. For example, when the wiring pattern is continuously cut out in the slit 315, the wiring pattern of another layer may be formed in the cutout portion.

Figure 7:
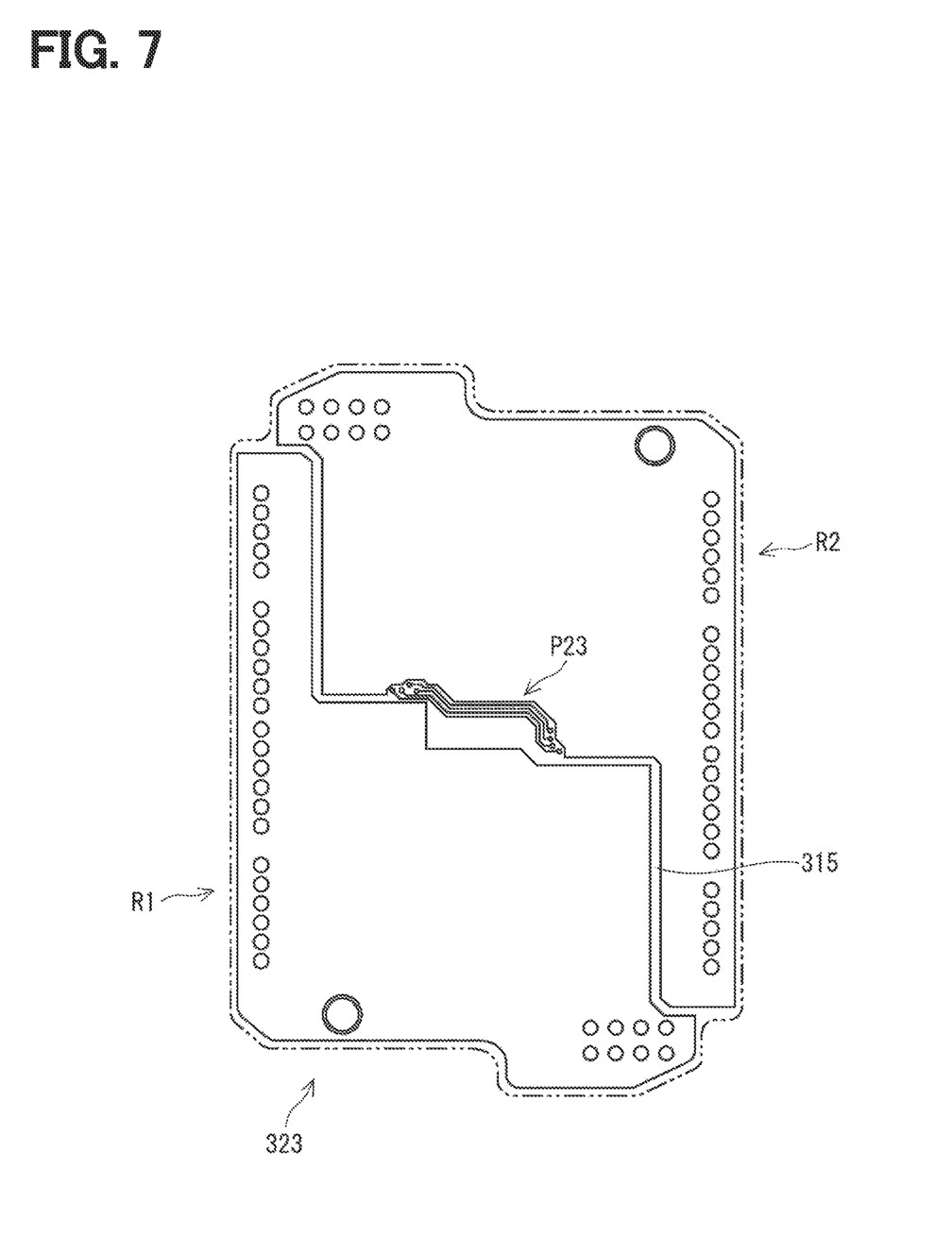
FIG. 7 is a schematic diagram showing a wiring pattern of a third layer according to the embodiment.
Figure 8:
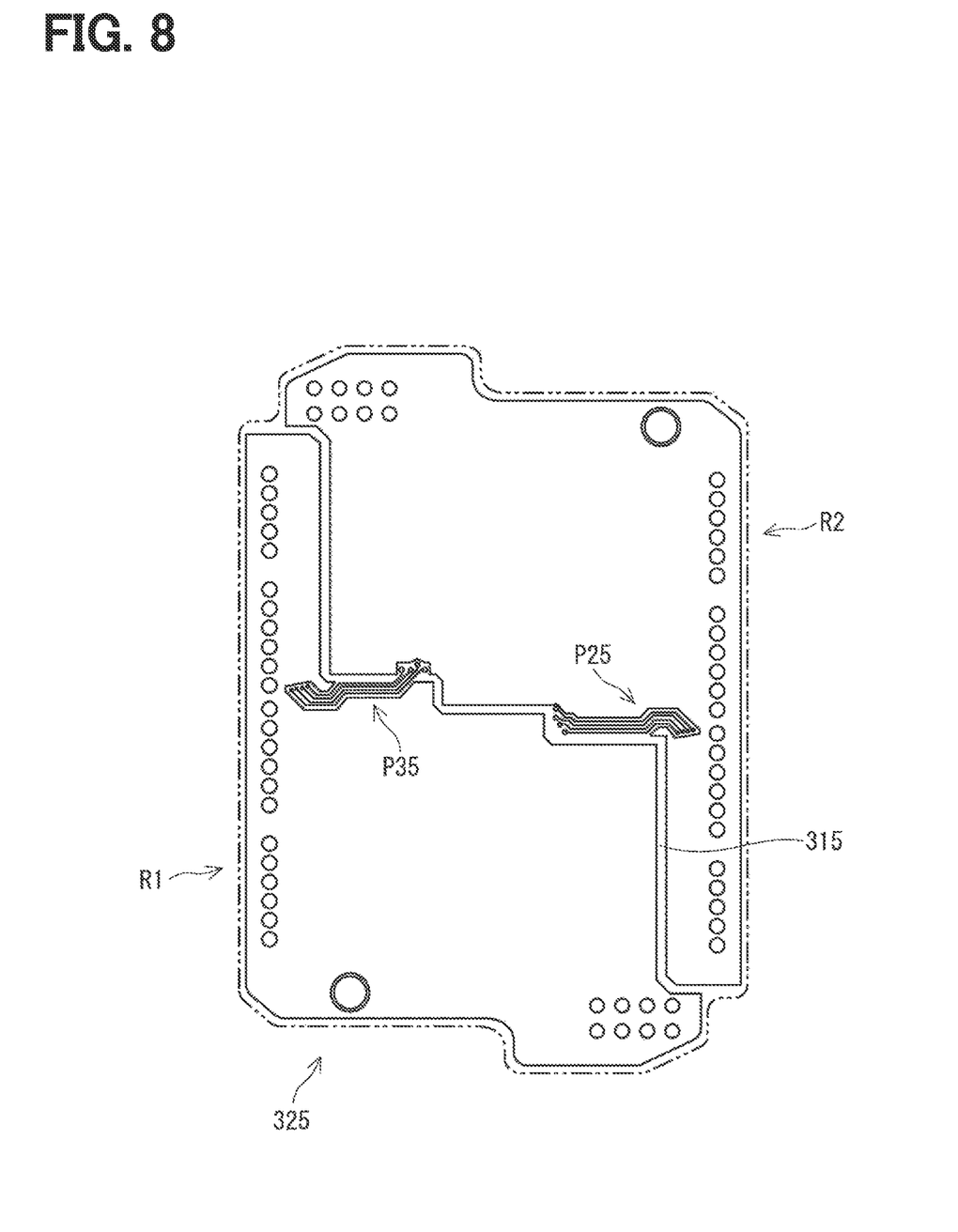
FIG. 8 is a schematic diagram showing a wiring pattern of a fifth layer according to the embodiment.
Figure 9:
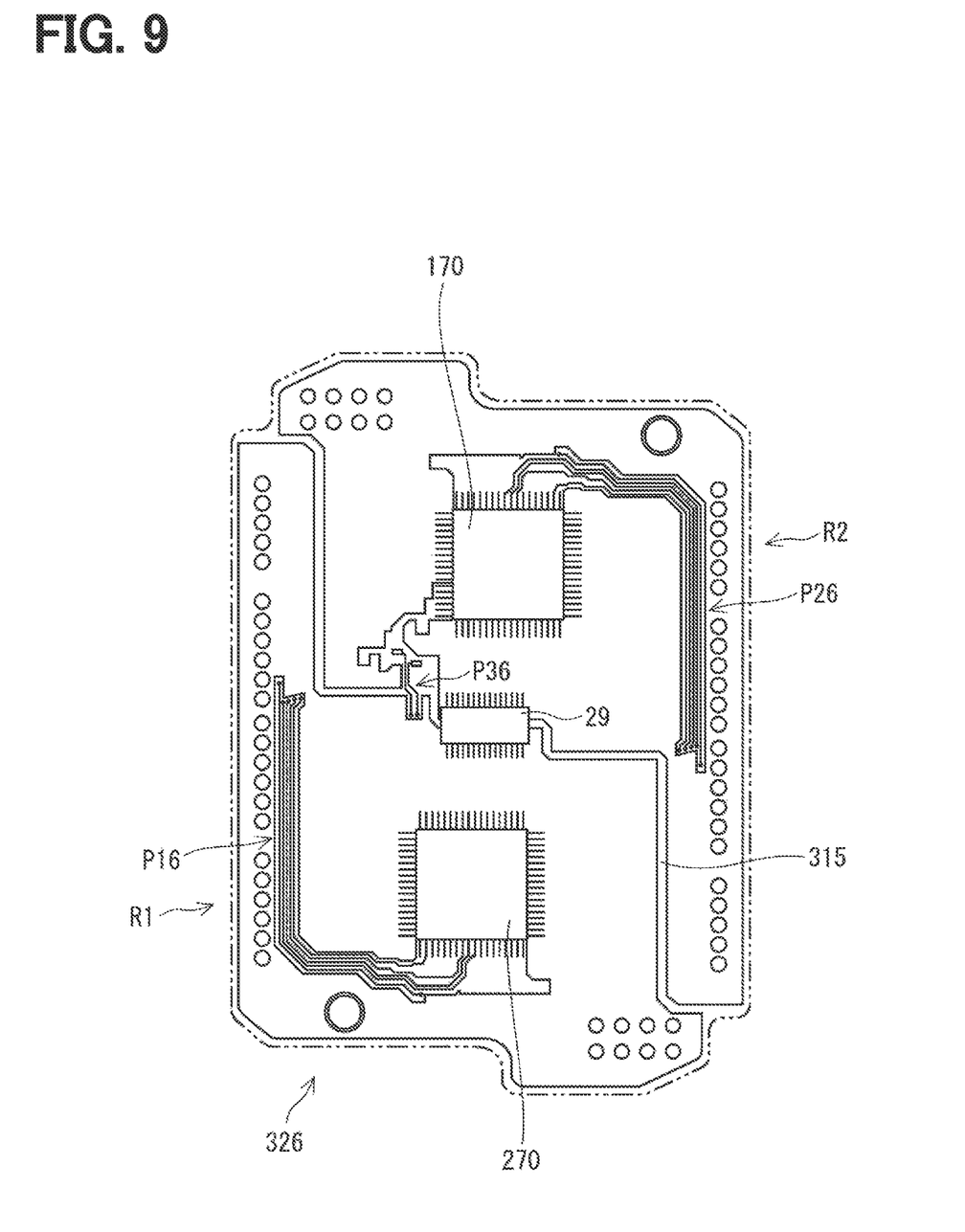
FIG. 9 is a schematic diagram showing a wiring pattern of a sixth layer according to the embodiment.

FIG. 7 shows the wiring pattern 323 in the third layer, FIG. 8 shows the wiring pattern 325 in the fifth layer, and FIG. 9 shows the wiring pattern 326 in the sixth layer. The first microcomputer 170 mounted in the first system area R1 and the second microcomputer 270 mounted in the second system area R2 perform inter-microcomputer communication on the communication line 45. The communication line 45 between the microcomputers is composed of patterns P16, P26, and P36 formed in the wiring pattern 326, patterns P25 and P35 formed in the wiring pattern 325, and a pattern P23 formed in the wiring pattern 323. The information from the first microcomputer 170 is output to the second microcomputer 270 via the patterns P16, P35, P23, P25, and P26. The information of the second microcomputer 270 is output to the first microcomputer 170 in the reverse order. Further, the microcomputers 170 and 270 can communicate with each other via the pattern P36 and other elements.

Figure 10:
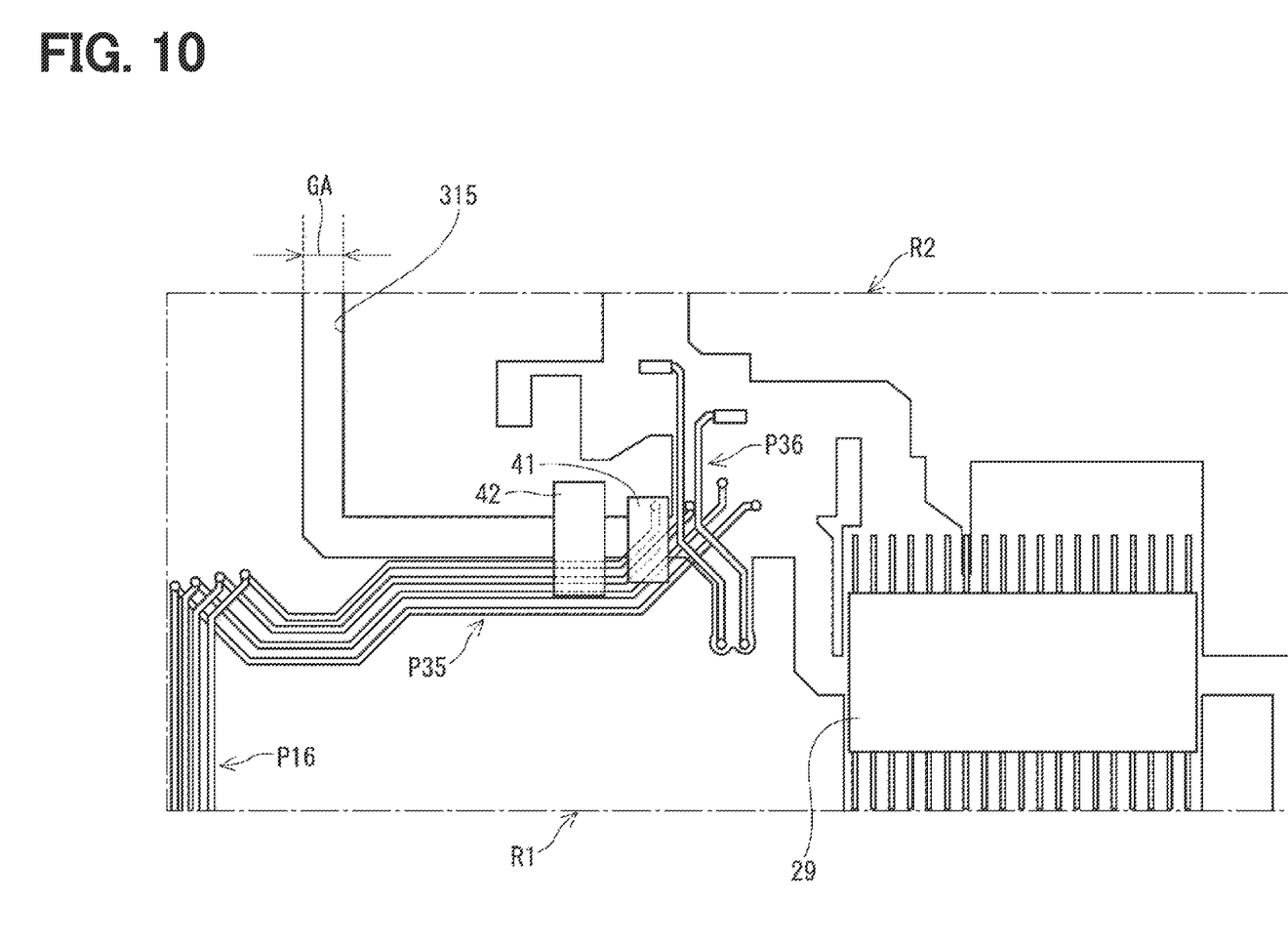
FIG. 10 is a schematic diagram showing a state in which the fifth layer and the sixth layer are overlapped according to the embodiment.

FIG. 10 is a superposed view in which the wiring patterns 325 and 326 are overlapped, is a view seen from the motor surface 311 side, and is inverted for the sake of explanation. As shown in FIG. 10, in the present embodiment, the pattern P35 formed on the fifth layer and the pattern P36 formed on the sixth layer cover the slit 315, and connects the first system area R1 and the second system area R2. Further, the pattern P35 and the pattern P36 intersect on the slit 315. In other words, the pattern P36 connects the systems at a location overlapping the pattern P35 when projected from one of the motor surface 311 and the anti-motor surface 312 onto the other.

The inter-system ground connection capacitor 41 is arranged adjacent to the pattern P36. Further, the inter-system ground connection capacitor 42 is arranged adjacent to the inter-system ground connection capacitor 41. In other words, one inter-system ground connection capacitor 41 is arranged between the pattern P36 and the other inter-system ground connection capacitor 42. Here, "arranged adjacent to" means that they are arranged in a state where no other electronic component is provided therebetween. In the present embodiment, the capacitor 42 has a larger capacity than the capacitor 41, but the capacities may be the same, and can be arbitrarily designed according to the mounting space, the required capacity, and the like.

Further, the inter-system ground connection capacitors 41 and 42 are arranged at locations overlapping the pattern P35 when projected from one of the motor surface 311 and the anti-motor surface 312 to the other. In the present embodiment, among the wiring patterns constituting the communication line 45, the pattern P35 and the pattern P36 connecting between the systems are arranged so as to overlap with each other by the slit 315, and the inter-system ground connection capacitors 41 and 42 are arranged at a part at which the pattern P35 and the pattern P36 intersect with each other. This configuration makes it possible to reduce communication noise.

As described above, the ECU 10 includes a plurality of systems of drive control components and the substrate 31. The drive control component can independently control the motor 80 as a control target for each system. In the present embodiment, the drive control component includes the microcomputers 170 and 270 and the integrated circuit units 175 and 275. Here, "the control target can be controlled independently for each system" is not limited to the case where each system is configured in the same manner. As long as the motor 80 can be driven by one system, specification and the like of each system may be different, for example, when one of the systems is normally used and the other system is used for backup, the system for backup is simplified compared to the system normally sued.

The drive control components are mounted on the substrate 31 by dividing the area for each system, and the slit 315 for separating the system areas R1 and R2 is formed in each of the wiring patterns 321 to 326 of the plurality of layers. The gap GA, which is the width of the slit 315, is formed larger than the minimum pattern gap GB in the substrate 31.

Further, the slit 315 is formed at the same position in all layers when projected from one side to the other side of the motor surface 311 and the anti-motor surface 312, which are the two main surfaces of the substrate 31. Here, the term "same position" means that a manufacturing error is allowed, and when a notch or the like continuous with the slit 315 is formed in the pattern, the notch or the like may be different between the layers. As a result, it is possible to suppress the occurrence of a short circuit between systems due to conductive foreign matter, ion migration, or the like, and thus it is possible to reduce the probability of simultaneous failure of a plurality of systems.

The microcomputers 170 and 270 can communicate with each other between the systems, and the wiring pattern constituting the communication line 45 between the microcomputers used for the inter-microcomputer communication crosses the slit 315 and connects the system areas R1 and R2. As a result, the microcomputers 170 and 270 can appropriately perform the inter-microcomputer communication.

The cross pattern, which is a wiring pattern that crosses the slit 315, is separated in the outermost layer and the inner layer of the substrate 31. Further, the pattern P36 which is the cross pattern of the outermost layer and the pattern P35 which is the cross pattern of the inner layer intersect with each other at a position where the slit 315 is formed when projected from one side to the other side of the motor surface 311 and the anti-motor surface 312 which are the two main surfaces of the substrate 31. As a result, the mounting area of the substrate 31 can be used with high efficiency as compared with the case where all the cross patterns are provided in the outermost layer, for example.

The ECU 10 includes the inter-system ground connection capacitors 41 and 42 that connects the ground patterns each corresponding to one of the systems and separated with each other. The inter-system ground connection capacitors 41 and 42 are mounted adjacently to the cross portion where the pattern P35 and the pattern P36 cross with each other. Since the inter-system ground connection capacitors 41 and 42 are mounted at adjacently to the crossing portion, communication noise can be reduced.

In this embodiment, the ECU 10 corresponds to an "electronic control device", the motor 80 corresponds to a "control target", the areas R1 and R2 correspond to "system areas", the control substrate 31 corresponds to a "substrate", and the motor surface 311 and the anti-motor surface 312 corresponds to "main surfaces". Further, the patterns P35 and P36 correspond to a "cross pattern", the sixth layer on which the pattern P36 is formed corresponds to an "outermost layer", and the fifth layer on which the pattern P35 is formed corresponds to an "inner layer".

Other Embodiments

In the above embodiment, the control substrate 31 has been mainly described. In other embodiments, electronic components such as electrolytic capacitors mounted on the power substrate 35 may be regarded as "drive control components", and the power substrate 35 may have a slit that separates system areas similarly to the control substrate 31. In the above embodiment, the switching element, the motor relay, and the shunt resistor are vertically arranged as power modules. In other embodiments, at least a part of the switching element, the motor relay and the shunt resistor may be mounted on the substrate. Further, these electronic components surface-mounted on the substrate may be regarded as "drive control components" and mounted by dividing the area for each system.

In the above embodiment, the power substrate and the control substrate are provided. In other embodiments, the number of substrates may be one or three or more. In the above embodiment, the substrate is a 6-layer substrate. In other embodiments, the number of layers of the substrate may be other than 6 layers, for example, 4 layers. Further, the substrate of the above embodiment is substantially rectangular. In other embodiments, the shape of the substrate may be other than rectangular, such as, such as a circular substrate.

In the above embodiment, the wiring pattern constituting the communication line between microcomputers crosses the slit. In other embodiments, when it is necessary to perform transmission and reception of information between systems other than the inter-microcomputer communication, a wiring pattern other than the communication line for microcomputers may cross the slit. In the above embodiment, the communication lines between the microcomputers are separately provided in the outermost layer and the inner layer. In other embodiments, the communication line between microcomputers may be provided in one layer. In the above embodiment, the cross pattern is provided on the outermost layer, the sixth layer, and the inner layer, the fifth layer. In other embodiments, the outermost layer may be the first layer, and the inner layer may be any of the second layer to the fourth layer.

In the above embodiment, the two inter-system ground connection capacitors are provided. In other embodiments, the number of inter-system ground connection capacitors may be one or three or more. In the above embodiment, the inter-system ground connection capacitor is provided adjacently to the crossing position of the cross pattern. In other embodiments, the inter-system ground connection capacitor may be provided at a position other than adjacent to the cross position of the cross pattern.

In the above embodiment, two sets of motor windings are provided, and the number of systems is two. In other embodiments, the number of systems may be three or more. Further, for example, one control circuit may be provided for a plurality of motor windings and a plurality of inverter circuits. A plurality of inverter circuits and a plurality of motor windings may be provided for one control circuit.

That is, the numbers of the motor windings, inverter circuits and control circuits may be different. Further, the number of motor windings and power supplies may be one.

In the above-described embodiments, the motor is a three-phase brushless motor. In other embodiments, the motor is not limited to the three-phase brushless motor, and any motor may be used. Further, the motor may also be a generator, or may be a motor-generator having both of a motor function and a generator function, i.e., not necessarily be limited to the rotating electric machine. Further, in the above embodiment, the control target is a motor. In other embodiments, the control target may be other than the motor.

In the above embodiments, the electronic control unit is applied to the electric power steering device. In other embodiments, the electronic control unit may be applied to other apparatuses different from the electric power steering device. As described above, the present disclosure is not limited to the embodiments described above, and can be implemented in various forms without departing from the spirit of the present disclosure.

The present disclosure has been described in accordance with the embodiments. However, the present disclosure is not limited to such embodiments and structures. The present disclosure also encompasses various modifications and variations within the scope of equivalents. Furthermore, various combination and formation, and other combination and formation including one, more than one or less than one element may be made in the present disclosure.

What is claimed is:

1. An electronic control device comprising:
   a plurality of drive control components grouped into systems, each of the systems being configured to independently control rotation of a motor, and
   a substrate (i) divided into areas, corresponding to the systems, on which at least a part of the drive control components is mounted by each of the systems, and (ii) having layers stacked, wherein
   each of the layers has a wiring pattern and forms a slit that divides the substrate into the areas defined as system areas, and
   the slit has a width greater than a minimum pattern gap in the substrate,
   wherein
   the wiring pattern that crosses the slit is defined as a cross pattern, and
   the cross pattern is separately provided in an outermost layer and an inner layer of the layers of the substrate,
   the electronic control device, further comprises
   an inter-system ground connection capacitor that (i) is mounted adjacently to a portion where the cross pattern of the outermost layer and the cross pattern of the inner layer overlap with each other and (ii) connects ground patterns corresponding to the systems and separated with each other.

2. The electronic control device according to claim 1, wherein
   the slit is formed at a same position in each of the layers when projected from one side to another side of two main surfaces of the substrate.

3. The electronic control device according to claim 1, wherein
   the plurality of drive control components include microcomputers,
   the microcomputers are configured to communicate with each other between the systems, and
   the wiring pattern that constitutes a communication line between the microcomputers crosses the slit and connects the system areas.

4. The electronic control device according to claim 1, wherein
   the cross pattern of the outermost layer and the cross pattern of the inner layer overlap with each other at a portion where the slit is formed when projected from one side to another side of two main surfaces of the substrate.

5. The electronic control device according to claim 1, wherein
   the plurality of drive control components grouped into systems includes:
      a drive control component of a first system that is configured to control rotation of the motor;
      a drive control component of a second system that is configured to control rotation of the motor, and
   the drive control component of the first system and the drive control component of the second system independently control rotation of the motor.

6. The electronic control device according to claim 1,
   An electronic control device comprising:
   a plurality of drive control components grouped into systems, each of the systems being configured to independently control rotation of a motor, and
   a substrate (i) divided into areas, corresponding to the systems, on which at least a part of the drive control components is mounted by each of the systems, and (ii) having layers stacked,
   wherein
   each of the layers has a wiring pattern and forms a slit that divides the substrate into the areas defined as system areas, and
   the slit has a width greater than a minimum pattern gap in the substrate,
   wherein
   the substrate comprises insulating layers between the layers of wiring patterns,
   the slit comprises a gap between wiring patterns of each respective system, and
   the insulating layers are continuous across the slit.

* * * * *